United States Patent
Chinnakkonda et al.

(10) Patent No.: US 7,805,696 B2
(45) Date of Patent: Sep. 28, 2010

(54) METHOD FOR FAST IDENTIFICATION OF AVAILABLE REFERENCE DESIGNATORS IN A DESIGN AUTOMATION SYSTEM

(75) Inventors: Diyanesh Chinnakkonda, Bangalore (IN); Benjamin J. Lyndgaard, Rochester, MN (US); John F. Mullen, Harmony, MN (US); Trevor J. Richert, Rochester, MN (US); Ay Vang, Vadnais Heights, MN (US)

(73) Assignee: International Business Machines Corporation, Armonk, NY (US)

( * ) Notice: Subject to any disclaimer, the term of this patent is extended or adjusted under 35 U.S.C. 154(b) by 408 days.

(21) Appl. No.: 11/866,159

(22) Filed: Oct. 2, 2007

(65) Prior Publication Data

US 2009/0089734 A1    Apr. 2, 2009

(51) Int. Cl.
    *G06F 17/50* (2006.01)
(52) U.S. Cl. .................................. 716/11; 716/18
(58) Field of Classification Search .............. 716/1, 716/11, 18
See application file for complete search history.

(56) References Cited

U.S. PATENT DOCUMENTS

| | | | | |
|---|---|---|---|---|
| 4,709,366 A | * | 11/1987 | Scott et al. ............... | 714/46 |
| 5,883,807 A | * | 3/1999 | Fanjoy ..................... | 716/8 |
| 7,546,571 B2 | * | 6/2009 | Mankin et al. ............ | 716/15 |
| 2003/0237057 A1 | * | 12/2003 | Riedl et al. ............... | 716/1 |
| 2006/0095882 A1 | * | 5/2006 | Mankin et al. ............ | 716/11 |
| 2006/0101368 A1 | * | 5/2006 | Kesarwani et al. ........ | 716/11 |

* cited by examiner

*Primary Examiner*—Sun J Lin
(74) *Attorney, Agent, or Firm*—Dillon & Yudell LLP

(57) ABSTRACT

A method, system, and computer program product for a faster identification of available reference designators (ARDs) in a design automation system. An ARD utility detects a selection of one or more selected component types for placement on a circuit schematic. A list containing one or more unavailable reference designators (URDs) is sorted through to identify one or more ARDs from the list of URDs. A list of ARDs is then generated, from which a pre-determined portion of ARDs are reserved. The reserved list of ARDs is then outputted for selection by a user.

12 Claims, 4 Drawing Sheets

METHOD FOR FAST IDENTIFICATION OF AVAILABLE REFERENCE DESIGNATORS IN A DESIGN AUTOMATION SYSTEM

BACKGROUND OF THE INVENTION

1. Technical Field

The present invention generally relates to computer systems and in particular to electronic design automation tools in computer systems.

2. Description of the Related Art

Electronic design automation (EDA) tools is the category of tools for designing and producing electronic circuit systems ranging from printed circuit boards (PCBs) to integrated circuits (ICs). EDA tools can be divided into several sub-categories of tools, which mostly align with the path of manufacturing from design to mask generation. One of these sub-categories of EDA tools, known as Schematic Capture/Entry tools, supports one or more logic circuit designers in the creation of an electronic diagram or electronic schematic of the designed electronic system. This process of schematic capture/entry is typically done interactively with the help of a schematic capture/entry tool also known as a schematic editor.

Given the large complexity of some electronic circuit systems, some large-scale design projects divide the design work among a team of logic circuit designers, who work simultaneously to complete their respective section of a circuit system. For instance, a large electronic circuit design can include hundreds or thousands of electronic components, such as active components (i.e., chipsets) and passive components (i.e., resistors, capacitors, inductors, and the like). Moreover, large-scale designs often require many changes during development, such as the addition or deletion of electronic components. Typically, logic circuit designers utilize schematic capture/entry tools for adding the required logic symbols in the schematic from a symbol/component library. In this regard, each logic symbol/component is associated with a unique reference designator, which is used to ensure proper connectivity among the captured and entered logic symbols/components.

Often with team-driven designs, a logic circuit designer working on a sub-circuit independently from the rest of the team members will inadvertently enter the same reference designator that is simultaneously being utilized by another logic circuit designer. As a result, overlaps in reference designators produce design errors, which prevent the logic circuit designer from importing a netlist into a physical design tool. A netlist is a list of logic components and their interconnections which make up an electronic circuit/system. Thus, the task of identifying unique reference designators for schematic entry in large-scale electronic circuits/systems is one task that requires a considerable amount of the logic circuit designers' time. In addition to reference designator overlap errors, it is also desirable to keep the names of reference designators to a minimal character count because of electronic card assembly vendor limitations. For instance, vendor limitations can include the truncation of characters that exceed a preset character length. As a result of the truncation, a contract manufacturer may end up with components/symbols that appear to contain the same reference designator, when in fact, the components were each assigned unique reference designators.

SUMMARY OF AN EMBODIMENT

Disclosed are a method, system, and computer program product for providing "available" reference designators for utilization within a schematic design. In this regard, the described embodiment assumes that a considerable number of reference designators have been previously selected and placed in a circuit schematic. A selection of one or more component types are detected for placement on the schematic. Then, a list containing one or more unavailable reference designators (URDs) is sorted through to identify one or more available reference designators (ARDs) from the list of URDs. A list of ARDs is then generated, from which a predetermined portion of ARDs are reserved. The reserved list of ARDs is then outputted for selection by a user. Once a selection is detected from among the outputted list of reserved ARDs, one or more selected reference designators is/are attached to one or more component types. Finally, one or more of the list of URDs and the list of ARDs is updated to reflect the current use of the selected reference designator.

Alternatively, if a selection is not detected from among the outputted list of reserved ARDs, a manual override using a candidate reference designator is detected and verified with the list of URDs. The verification step is to determine whether the candidate reference designator is included in the list of URDs and, hence, unavailable.

The above, as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The illustrative embodiments provide a method, system, and computer program product for providing "available" reference designators for utilization within a schematic design.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

Figure 1:
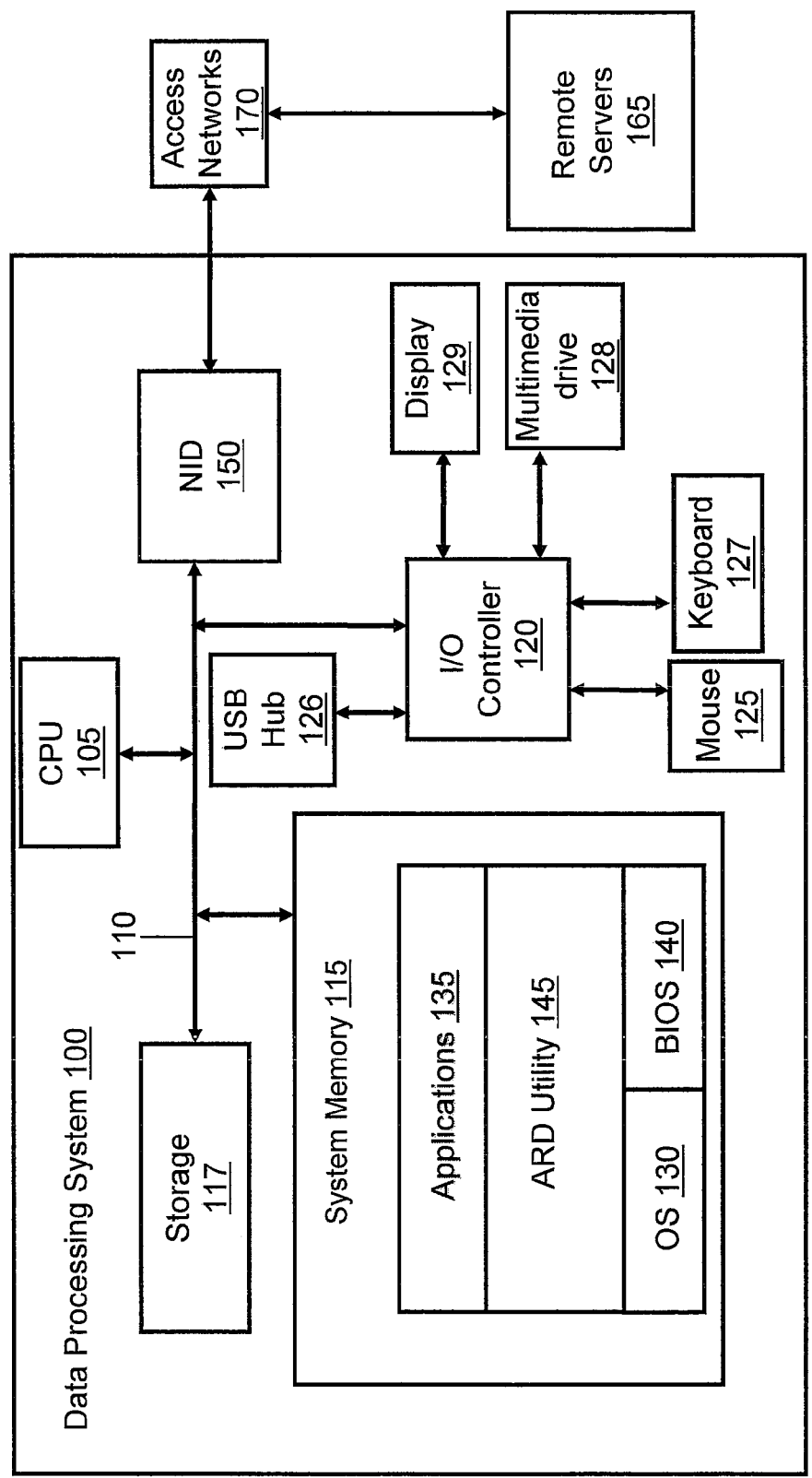
FIG. 1 is a high level block diagram representation of a data processing system, according to one embodiment of the invention.

With reference now to FIG. 1, depicted is a block diagram representation of data processing system (DPS) 100. DPS 100 comprises at least one processor or central processing unit (CPU) 105 connected to system memory 115 via system interconnect/bus 110. Also connected to system bus 110 is I/O controller 120, which provides connectivity and control for input devices, of which pointing device (or mouse) 125 and keyboard 127 are illustrated, and output devices, of which display 129 is illustrated. Additionally, multimedia drive 128 (e.g., CDRW or DVDRW drive) and Universal Serial Bus (USB) hub 126 are illustrated, coupled to I/O controller 120. Multimedia drive 128 and USB hub 126 may operate as both input and output (storage) mechanisms. DPS 100 also comprises storage 117, within which data/instructions/code may be stored. DPS 100 is also illustrated with network interface device (NID) 150 coupled to system bus 110. NID 150 enables DPS 100 to connect to one or more remote servers 165 via access networks 170, such as the Internet.

In the described embodiments, when access network 170 is the Internet, access network 170 represents a worldwide collection of networks and gateways that utilize the Transmission Control Protocol/Internet Protocol (TCP/IP) suite of protocols to communicate with one another. Of course, network access may also be provided via a number of different types of networks, such as an intranet, an Ethernet, a Local Area Network (LAN), a Virtual Private Network (VPN), or other Wide Area Network (WAN) other than the Internet, for example.

Notably, in addition to the above described hardware components of DPS 100, various features of the invention are completed via software (or firmware) code or logic stored within system memory 115, in other storage (e.g., storage 117), or stored remotely in memory of server 165 and executed by CPU 105. System memory 115 is defined as a lowest level of volatile memory (not shown), including, but not limited to, cache memory, registers, and buffers. In one embodiment, data/instructions/code stored in remote memory of remote server 165 populates the system memory 115, which is also coupled to system bus 110. In another embodiment, the data/instructions/code are stored and executed remotely from remote server 165 and accessed by DPS 100 via NID 150.

Illustrated within system memory 115 are a number of software/firmware components, including operating system (OS) 130 (e.g., Microsoft Windows®, a trademark of Microsoft Corp; or GNU®/Linux®, registered trademarks of the Free Software Foundation and The Linux Mark Institute; or Advanced Interactive eXecutive—AIX—, registered trademark of International Business Machines—IBM), applications (APP) 135, Basic Input/Output System (BIOS) 140 and Available Reference Designator (ARD) utility 145. In actual implementation, components or code of OS 130 may be combined with those of ARD utility 145, collectively providing the various functional features of the invention when the corresponding code is executed by the CPU 105. For simplicity, ARD utility 145 is illustrated and described as a stand alone or separate software/firmware component, which is stored in system memory 115 to provide/support the specific novel functions described herein.

CPU 105 executes ARD utility 145 as well as OS 130, which supports the user interface features of ARD utility 145. In the illustrative embodiment, ARD utility 145 facilitates the identification of available reference designators for use in a schematic design. Among the software code/instructions provided by ARD utility 145, and which are specific to the invention, are code for: (a) detecting a circuit component type for schematic placement; (b) extracting and sorting a list of unavailable reference designators (URDs); (c) identifying available reference designators (ARDs) from the sorted list of URDs; (d) generating a list of ARDs; (e) reserving a partial list containing a predetermined portion of ARDs for each logic circuit designer to use; (f) outputting the partial list of ARDs; (g) detecting a component selection from the list of ARDs; (h) detecting whether a manual override using a candidate reference designator has occurred; (i) attaching the selected reference designator(s) to the component type; and (j) updating at least one of the list of URDs and the list of ARDs. In addition, if a manual override has been detected, further code/instructions include code for (k) verifying that the candidate reference designator has not been already used (i.e., included in a sorted list of ARDs). Moreover, if a removal of an attached reference designator is detected, the list of URDs is updated.

For simplicity of the description, the collective body of code that enables these various features is referred to herein as ARD utility 145. According to the illustrative embodiment, when CPU 105 executes ARD utility 145, DPS 100 initiates a series of functional processes that enable the above functional features as well as additional features/functionality, which are described below within the description of FIGS. 2-3.

Those of ordinary skill in the art will appreciate that the hardware and basic configuration depicted in FIG. 1 may vary. For example, other devices/components may be used in addition to or in place of the hardware depicted. The depicted example is not meant to imply architectural limitations with respect to the present invention. The data processing system depicted in FIG. 1 may be, for example, an IBM System X, a product of International Business Machines Corporation in Armonk, N.Y., running the AIX operating system or LINUX operating system.

Within the descriptions of the figures, similar elements are provided similar names and reference numerals as those of the previous figure(s). Where a later figure utilizes the element in a different context or with different functionality, the element is provided a different leading numeral representative of the figure number (e.g., 1xx for FIGS. 1 and 2xx for FIG. 2). The specific numerals assigned to the elements are provided solely to aid in the description and not meant to imply any limitations (structural or functional) on the invention.

Figure 2:
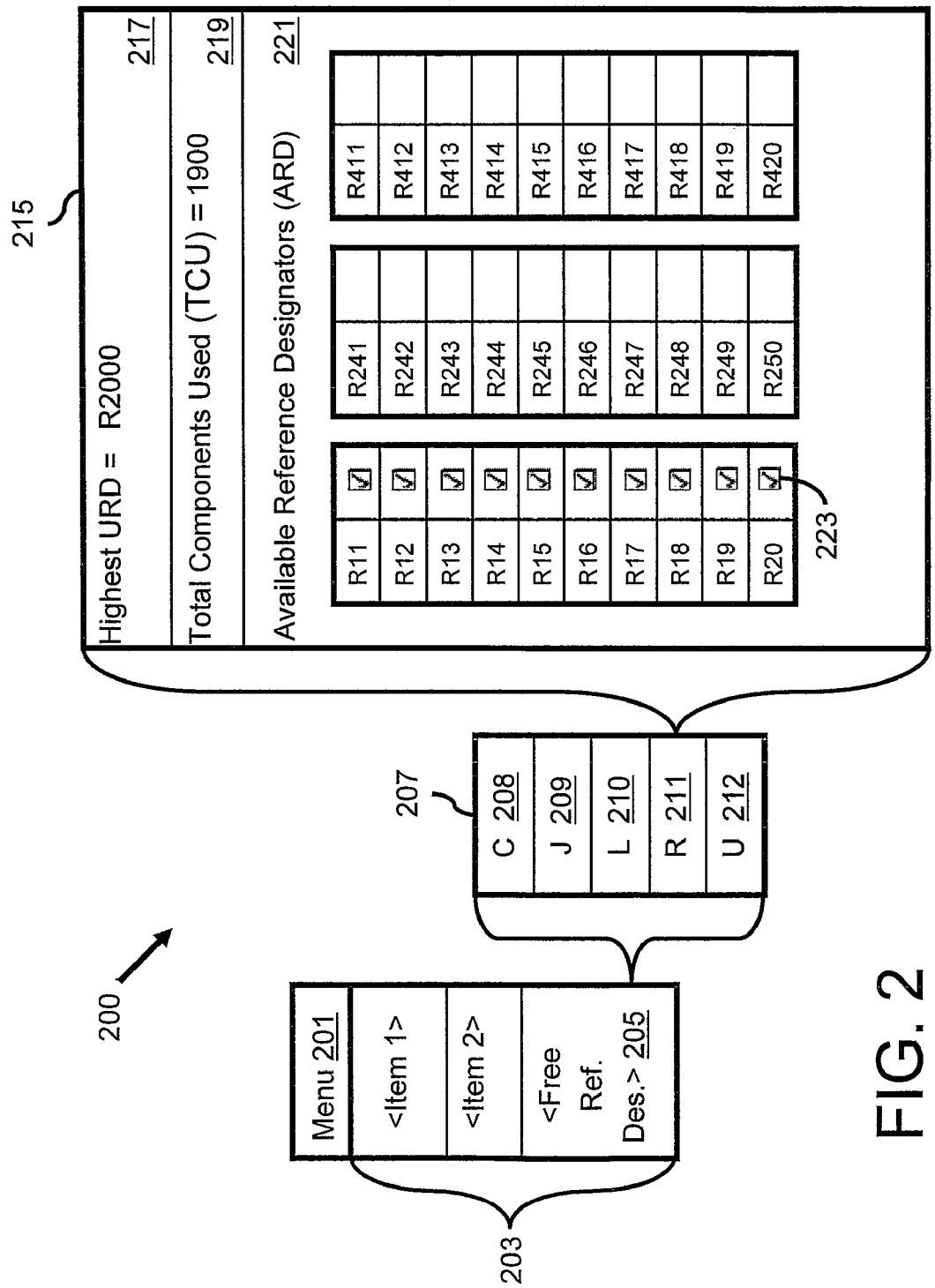
FIG. 2 is a high level block diagram of an exemplary Available Reference Designator (ARD) display interface, in accordance with one embodiment of the invention.

With reference now to FIG. 2, exemplary Available Reference Designator (ARD) display interface 200 is shown, according to one embodiment of the invention. The ARD display interface 200 includes Menu folder 201. When selected, Menu folder 201 displays dropdown box 203 containing a number of menu items, including <Free Ref. Des.> 205. When menu item <Free Ref. Des.> 205 is selected, Component Type window 207 is displayed. Component Type window 207 displays a list of component types 208-212 to select from. Component types 'C' 208, 'J' 209, 'L' 210, 'R' 211, and 'U' 212 refer respectively to capacitors, connectors, inductors, resistors, and integrated circuits (ICs). It should be appreciated that the invention is not limited to the component types exemplified in FIG. 2, and that any other type of quantifiable circuit component can be used.

According to the exemplary embodiment shown in FIG. 2, when one or more of the component types 208-212 are selected, reference designator (RD) information box 215 is displayed. RD information box 215 provides a logic circuit designer with information regarding both unavailable (i.e., used and/or reserved) and available (i.e., unused) components/symbols associated with one or more selected component types 208-212. For example, RD information box 215 includes Highest-Unavailable Reference Designator (URD) box 217 that displays an alphanumeric reference designator (e.g., R2000) corresponding to the alphanumerically highest reference number of a selected component type (i.e., component type 'R' 211). URDs are reference designators that are currently used or reserved by one or more logic circuit designers for use in a circuit schematic. RD information box 215 also includes URD total box 219 that displays the total number of components/symbols that have been: (i) used for a particularly selected component type(s) 208-212, and/or (ii) reserved by another logic circuit designer for use in a circuit schematic. According to the example shown, the total number of resistors 'R' 211 used in the exemplary circuit schematic (not shown) is 1,900.

RD information box 215 includes Available Reference Designator (ARD) selection box 221. ARD selection box 221 displays a complete list of ARDs corresponding to one or more selected component types 208-212. In the example shown in FIG. 2, since component type 'R' 211 is selected from Component Type window 207, ARD selection box 221 displays a complete list of ARDs associated with component type 'R' 211. In this regard, the list of ARDs includes ARDs that are alphanumerically below the highest URD (e.g., R2000) of a selected component type. Although the exemplary embodiment shown in FIG. 2 shows ARD selection box 221 displaying a partial list of thirty ARDs corresponding to a selected component type 'R' 211, the invention is not limited in this regard. Furthermore, it should be appreciated that ARD selection box 221 can also display a complete list of ARD's. A complete ARD list may be displayed to a user if: (i) a complete listing of ARDs would not be unnecessarily lengthy to list, and/or (ii) no other designers are working simultaneously on a schematic (i.e., no potential for ARD overlap exists). From ARD selection box 221, a logic circuit designer can select and reserve one or more ARDs for use in a circuit schematic (i.e., selection of ARDs is indicated by checked boxes 223).

Figure 3A:
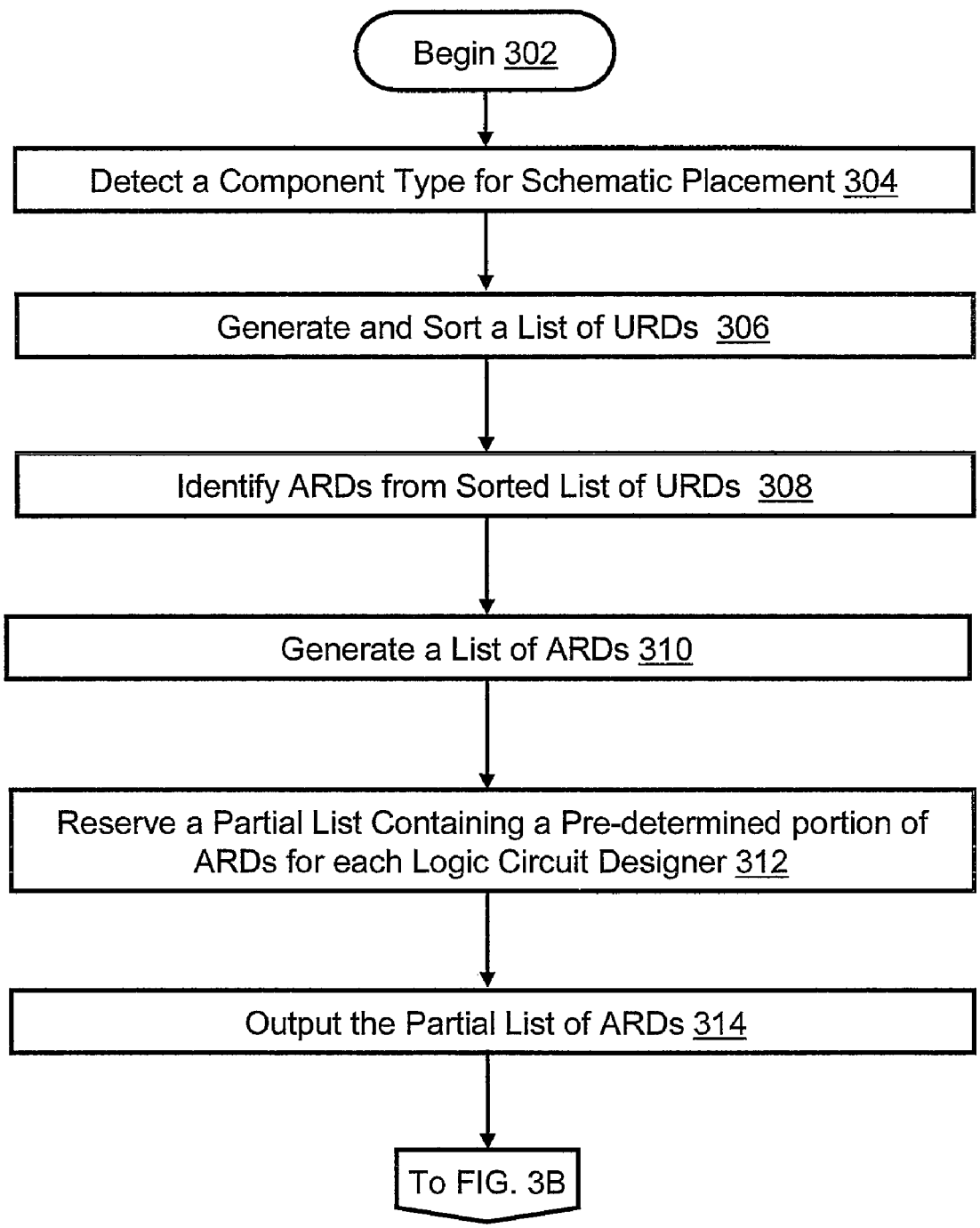
FIGS. 3A and 3B represent individual parts of a high level logical flowchart illustrating an exemplary method of providing available reference designators for use in a schematic design, in accordance with one embodiment of the invention.
Figure 3B:
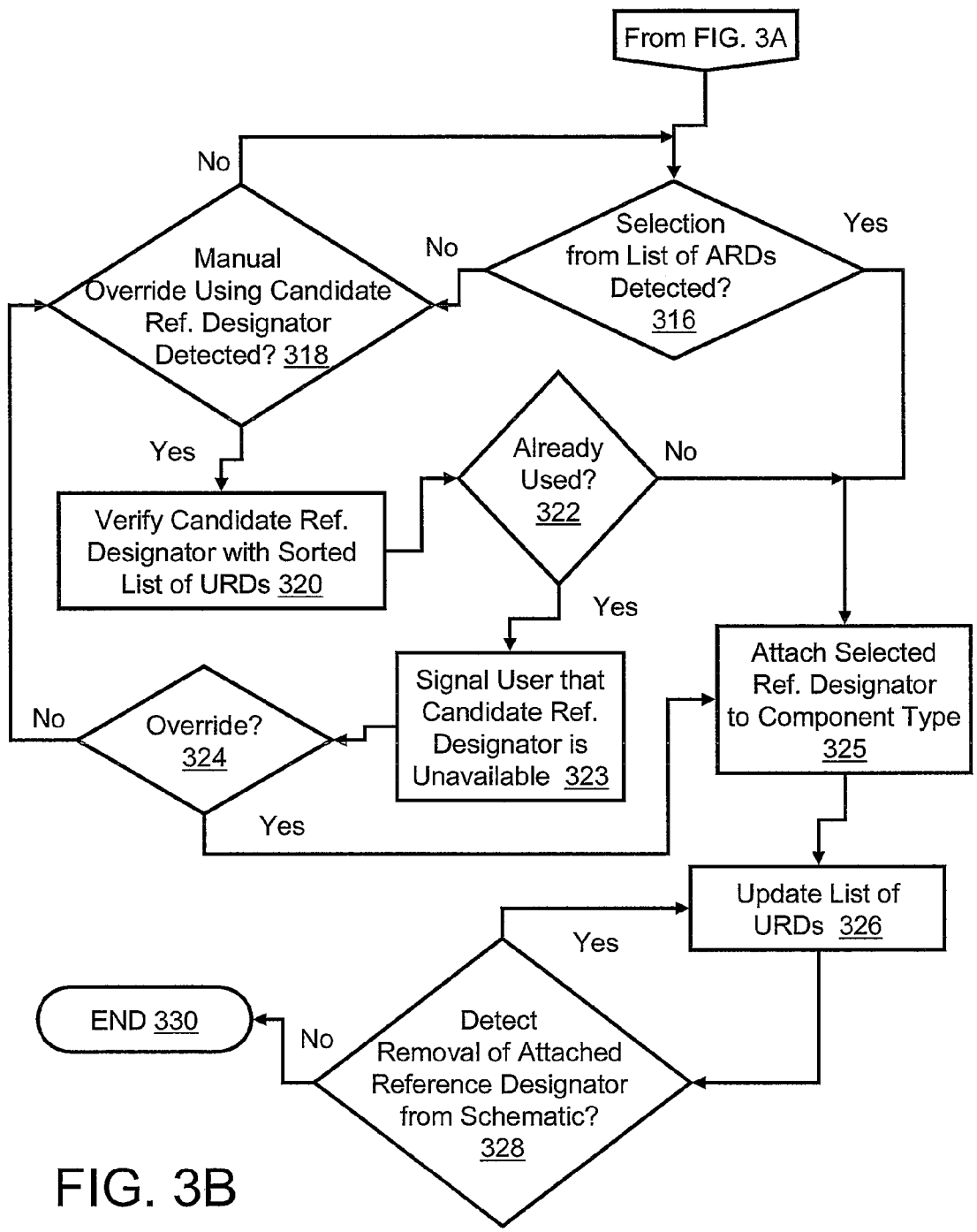

FIGS. 3A and 3B represent portions of flow chart 300 illustrating the exemplary method steps used to implement and utilize the method of identifying ARDs for utilization within a schematic design. Although the following methods illustrated in FIGS. 3A and 3B may be described with reference to components shown in FIGS. 1 and 2, it should be understood that this exemplary method is merely for convenience and alternative components and/or configurations thereof can be employed when implementing the various methods. Key portions of the methods may be completed by ARD utility 145 (FIG. 1). ARD utility 145 executes within DPS 100 (FIG. 1). Moreover, ARD utility 145 controls specific operations of/on DPS 100 and ARD display interface 200. Thus, the methods are described from the perspective of ARD utility 145, DPS 100 and/or ARD display interface 200. Before proceeding with the main discussion of flowchart 300, it is important to place the described embodiment in its proper context. In this regard, the circuit schematic described in flowchart 300 is assumed to have been previously populated with a considerable number of reference designators of component types 208-212. In this way, ARD utility 145 facilitates the identification of ARDs from among the previously-used (i.e. unavailable) reference designators.

The method of FIG. 3A begins at initiator block 302 and proceeds to block 304, in which ARD utility 145 detects a selection of one or more component types 208-212 for placement on a schematic. Following the example illustrated in FIG. 2, the logic circuit designer may require ten resistor components to be placed in a circuit schematic in addition to the 1,900 resistor components already in use (across the design team). Thus, a logic circuit designer will select a particular component type (e.g., 'R' 211) from component type box 207. The selected component type is detected by ARD utility 145, which then sorts through a list of URDs, as depicted in block 306. The URDs are stored in a predefined table or text file (not shown) that alphanumerically lists the components of a particular type (e.g., unavailable resistors R1-R10, R21-R240, R251-R410, etc.).

Once the URD list has been sorted, ARD utility 145 proceeds to identify ARDs of the selected component type by parsing through the sorted list of URDs, as depicted in block 308. The identification of ARDs can be achieved by starting with the lowest URD and identifying gaps in the alphanumeric sequence as the URD count is incremented. This parsing continues until the highest URD is reached. A list of ARDs is then generated, as depicted in block 310. To avoid ARD overlap between multiple logic circuit designers working simultaneously on a schematic, ARD utility 145 reserves a predetermined portion of the total ARDs for each logic circuit designer and displays the reserved portion of ARDs in ARD selection box 221, as depicted in block 312. In this regard, a partial list of ARDs (e.g., first thirty ARDs) or, alternatively, a complete list of ARDs can be outputted (block 314) to an individual designer depending upon the needs of the design project. In the example shown in FIG. 2, ARD selection box 221 displays a partial, reserved list of thirty ARDs of component type 'R' 211. The remaining seventy un-displayed ARDs may be displayed in a second ARD selection box 221 for another logic circuit designer to select from another workstation.

Referring now to block 316 of FIG. 3B, a determination is made whether a designer's selection from the partial, reserved list of ARDs has been detected. If a partial, reserved list of ARDs is not detected, the method proceeds to decision block 318, in which a determination is made whether a manual override using a candidate reference designator has been detected. A manual override refers to an event in which a logic circuit designer selects a reference designator (i.e., a candidate reference designator) that is not included in the partial, reserved list of ARDs that is outputted to the designer. Examples of candidate reference designators include non-standard reference designators (e.g., R1a) and/or reference designators that are part of the complete list of ARDs, but not part of the partial list of ARDs that is outputted to the designer. If a manual override condition is not detected, the method returns to block 316.

However, if a manual override condition is detected, the candidate reference designator is verified with the sorted list of URDs to ensure that the candidate reference designator is available, as depicted in block 320. The method proceeds to decision block 322, which determines whether the candidate reference designator is available. If the candidate reference designator is not available (i.e., included in the sorted list of URDs), the process continues to block 323, where ARD utility 145 signals to the user that the candidate reference designator is unavailable. If a user override of the current candidate reference designator is not detected in decision block 324, the process returns to decision block 318 to await an entry of a different candidate reference designator. If either (i) a candidate reference designator is available from decision box 322 (i.e., candidate reference designator is not already used), (ii) a reference designator from the list of ARDs is detected from decision box 316, or (iii) a user override of the current candidate reference designator is detected from decision box 324, the method proceeds to block 325 in which the selected reference designator is attached to the selected component type 208-212. According to the exemplary embodiment illustrated in FIG. 2, the selected reference designator attaches to selected component type 'R' 211. Once the selected reference designator attaches to selected component type 'R' 211, ARD utility 145 updates the list of URDs to reflect that the newly attached reference designator is unavailable for subsequent reuse in the schematic, as depicted in block 326.

Moreover, if the logic circuit designer later determines that the newly attached reference designator should be removed from the schematic, the method continues to decision block 328, in which ARD utility 145 detects whether an attached reference designator has been removed from the circuit schematic. If a removal is detected, the URD list is updated to reflect the current availability of the removed reference designator (i.e., removing the attached reference designator from the list of URDs). The method terminates at block 330.

According to another embodiment of the invention, ARD utility 145 identifies an ARD by parsing through an existing (i.e., previously generated) list of ARDs. The logic circuit designer selects a reference designator corresponding to a particular component type from the existing list of ARDs, rendering the selected reference designator unavailable (i.e., used or reserved by the logic circuit designer). Once the ARD utility 145 attaches the selected reference designator to one of the group of component types 208-212, the existing list of ARDs is updated by removing the selected reference designator from the existing list of ARDs. Conversely, if the selected reference designator is removed from a circuit schematic, the existing list of ARDs is updated by adding the selected reference designator to the existing list of ARDs.

In the flow chart above (FIG. 3A-3B), one or more of the methods are embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the processes in embodiments of the present invention may be implemented using any combination of software, firmware, or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media includes recordable-type (tangible) media such as floppy disks, thumb drives, hard disk drives, CD ROMs, DVD ROMs, and transmission-type media such as digital and analog communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A computer-implemented method for identifying available reference designators in a schematic entry tool comprising:
   a processor executing code that performs the function of:
      detecting a selection of one or more component types for placement on a schematic;
      sorting through a list of one or more Unavailable Reference Designators (URDs);
      generating a list of Available Reference Designators (ARDs), wherein the list of ARDs identifies one or more ARDs from the list of URDs;
      reserving a list containing a pre-determined portion of ARDs;
      outputting the list containing the pre-determined portion of reserved ARDs;
      detecting a selection from the outputted list of reserved ARDs;
      attaching a selected reference designator to the one or more component types; and
      updating at least one of the list of URDs and the list of ARDs.

2. The method of claim 1, wherein the functions performed further comprises:
   detecting a manual override condition using a candidate reference designator;

verifying availability of the candidate reference designator with the list of URDs; and detecting whether the candidate reference designator is included with the list of URDs.

3. The method of claim 1, wherein the functions performed further comprises:

detecting whether the selected reference designator is removed from the schematic; and updating at least one of the list of URDs to remove at least one attached reference designator from the list of URDs.

4. The method of claim 1, wherein the list of reserved ARDs includes ARDs that are alphanumerically below the highest URD of a selected component type.

5. A computer system comprising:

a processor unit;

a memory coupled to the processor unit; and an Available Reference Designator (ARD) utility executing on the processor unit and having executable code for:

detecting a selection of one or more component types for placement on a schematic;

sorting through a list of one or more Unavailable Reference Designators (URDs);

generating a list of Available Reference Designators (ARDs), wherein the list of ARDs identifies one or more ARDs from the list of URDs;

reserving a list containing a pre-determined portion of ARDs;

outputting the list containing the pre-determined portion of reserved ARDs;

detecting a selection from the outputted list of reserved ARDs;

attaching a selected reference designator to the one or more component types; and updating at least one of the list of URDs and the list of ARDs.

6. The computer system of claim 5, the ARD utility further having executable code for:

detecting a manual override condition using a candidate reference designator;

verifying availability of the candidate reference designator with the list of URDs; and detecting whether the candidate reference designator is included with the list of URDs.

7. The computer system of claim 5, the ARD utility further having executable code for:

detecting whether the selected reference designator is removed from the schematic; and updating at least one of the list of URDs to remove at least one attached reference designator from the list of URDs.

8. The computer system of claim 5, wherein the list of reserved ARDs includes ARDs that are alphanumerically below the highest URD of a selected component type.

9. A computer program product comprising:

a computer storage medium; and program code on the computer storage medium that when executed by a computer, provides the functions of:

detecting a selection of one or more component types for placement on a schematic;

sorting through a list of one or more Unavailable Reference Designators (URDs);

generating a list of Available Reference Designators (ARDs), wherein the list of ARDs identifies one or more ARDs from the list of URDs;

reserving a list containing a pre-determined portion of ARDs;

outputting the list containing the pre-determined portion of reserved ARDs;

detecting a selection from the outputted list of reserved ARDs;

attaching a selected reference designator to the one or more component types; and updating at least one of the list of URDs and the list of ARDs.

10. The computer program product of claim 9, the program code further provides the functions of:

detecting a manual override condition using a candidate reference designator;

verifying availability of the candidate reference designator with the list of URDs; and detecting whether the candidate reference designator is included with the list of URDs.

11. The computer program product of claim 9, the program code further provides the functions of:

detecting whether the selected reference designator is removed from the schematic; and updating at least one of the list of URDs to remove at least one attached reference designator from the list of URDs.

12. The computer program product of claim 9, wherein the list of reserved ARDs includes ARDs that are alphanumerically below the highest URD of a selected component type.

* * * * *